(12) United States Patent
Sakaguchi

(10) Patent No.: US 9,936,560 B2
(45) Date of Patent: Apr. 3, 2018

(54) ORGANIC EL PANEL CONTROL DEVICE, LIGHT SOURCE DEVICE, ORGANIC EL PANEL CONTROL METHOD, PROGRAM, AND RECORDING MEDIUM

(71) Applicant: NEC LIGHTING, LTD., Tokyo (JP)

(72) Inventor: Yoshikazu Sakaguchi, Tokyo (JP)

(73) Assignee: NEC LIGHTING, LTD., Tokyo (JP)

(*) Notice: Subject to any disclaimer, the term of this patent is extended or adjusted under 35 U.S.C. 154(b) by 0 days.

(21) Appl. No.: 15/320,191

(22) PCT Filed: Apr. 17, 2015

(86) PCT No.: PCT/JP2015/061891
§ 371 (c)(1),
(2) Date: Dec. 19, 2016

(87) PCT Pub. No.: WO2015/198699
PCT Pub. Date: Dec. 30, 2015

(65) Prior Publication Data
US 2017/0142805 A1 May 18, 2017

(30) Foreign Application Priority Data

Jun. 26, 2014 (JP) ................................. 2014-131847

(51) Int. Cl.
*H05B 37/02* (2006.01)
*H01L 51/52* (2006.01)
(Continued)

(52) U.S. Cl.
CPC ....... *H05B 33/0896* (2013.01); *G09G 3/3208* (2013.01); *H01L 27/3211* (2013.01);
(Continued)

(58) Field of Classification Search
CPC ......... H01L 27/3211; H01L 2251/5338; H01L 2251/5361; H01L 27/3209; H01L 51/5012;
(Continued)

(56) References Cited

U.S. PATENT DOCUMENTS 6,911,961 B2* 6/2005 Miller .................. G09G 3/3216
315/169.3
6,980,180 B2* 12/2005 Hasagawa ............ G09G 3/3241
345/204
(Continued)

FOREIGN PATENT DOCUMENTS

EP 1576854 9/2005
EP 2610887 7/2013
(Continued)

OTHER PUBLICATIONS

International Search Report dated Jul. 14, 2015 in corresponding PCT/JP2015/061891.

*Primary Examiner* — Vibol Tan
(74) *Attorney, Agent, or Firm* — Young & Thompson

(57) ABSTRACT

The present invention aims to provide an organic EL panel control device, a light source device, and an organic EL panel control method, capable of inhibiting the change (shift) in color temperature of white light produced by an organic EL panel to be controlled. The organic EL panel control device according to the present invention includes a luminance control unit. The luminance control unit controls, among a plurality of organic EL elements with different emission colors in an organic EL panel to be controlled, luminances of organic EL elements other than a reference organic EL element having a shortest luminance life in such a manner that, with reference to a luminance of the reference organic EL element, white light produced by additive color mixture of different colors of light emitted from the plurality
(Continued)

of organic EL elements has the same color temperature as a previously set color temperature.

10 Claims, 7 Drawing Sheets

(51) Int. Cl.
    *G09G 3/32*     (2016.01)
    *H05B 33/08*     (2006.01)
    *H01L 27/32*     (2006.01)
    *H05B 33/12*     (2006.01)
    *H01L 51/56*     (2006.01)
    *G09G 3/3208*     (2016.01)

(52) U.S. Cl.
    CPC .............. *H01L 51/52* (2013.01); *H01L 51/56* (2013.01); *H05B 33/12* (2013.01); *H05B 37/02* (2013.01)

(58) Field of Classification Search
    CPC ........... G09G 3/3208; G09G 2320/041; G09G 2320/0666; G09G 3/2003; H05B 33/0896; H05B 37/02; H05B 33/0857; H05B 33/12
    See application file for complete search history.

(56) References Cited

U.S. PATENT DOCUMENTS

| | | | |
|---|---|---|---|
| 7,161,566 B2 * | 1/2007 | Cok | G09G 3/3208 345/204 |
| 7,456,852 B2 * | 11/2008 | Mori | G09G 3/20 345/690 |
| 7,663,300 B2 | 2/2010 | Hack et al. | |
| 7,982,385 B2 * | 7/2011 | Kimura | H01L 27/3213 313/503 |
| 8,100,734 B2 | 1/2012 | Hack et al. | |
| 8,154,191 B2 * | 4/2012 | Xia | C09K 11/7734 252/301.4 F |
| 9,338,855 B2 * | 5/2016 | Hirasawa | H01L 27/3211 |
| 9,666,118 B2 * | 5/2017 | Hsieh | G09G 3/2074 |
| 9,698,361 B2 * | 7/2017 | Sakaguchi | H01L 51/0097 |
| 2004/0032205 A1 | 2/2004 | Hack et al. | |
| 2006/0055639 A1 * | 3/2006 | Yamada | G09G 3/325 345/77 |
| 2006/0231830 A1 * | 10/2006 | Matsuda | H01L 51/001 257/40 |
| 2007/0029906 A1 | 2/2007 | Hack et al. | |
| 2014/0071030 A1 * | 3/2014 | Lee | G09G 3/3208 345/82 |
| 2015/0054815 A1 * | 2/2015 | Toyoda | G09G 3/3233 345/212 |

FOREIGN PATENT DOCUMENTS

| | | |
|---|---|---|
| JP | 2003-195817 | 7/2003 |
| JP | 2003-280578 | 10/2003 |
| JP | 2004-325565 | 11/2004 |
| JP | 2005-10227 | 1/2005 |
| JP | 2006-504231 | 2/2006 |
| JP | 2007-240802 | 9/2007 |
| JP | 2008-122516 | 5/2008 |
| JP | 2010-266828 | 11/2010 |
| JP | 2012-33447 | 2/2012 |
| WO | 2004/017678 | 2/2004 |

* cited by examiner

ORGANIC EL PANEL CONTROL DEVICE, LIGHT SOURCE DEVICE, ORGANIC EL PANEL CONTROL METHOD, PROGRAM, AND RECORDING MEDIUM

TECHNICAL FIELD

The present invention relates to an organic EL panel control device, a light source device, an organic EL panel control method, a program, and a recording medium.

BACKGROUND ART

An organic EL panel uses, for example, organic electroluminescence (EL) elements that produce white light (white organic EL elements) by additive color mixture of colors of light emitted from, e.g., red, green, and blue (RGB) light emitting materials. For example, Patent Document 1 discloses an example of the configuration of white organic EL elements, in which single color light emitting layers for RGB are formed in parallel on a substrate.

CITATION LIST

Patent Document(s)

Patent Document 1: Japanese Translation of PCT International Application Publication No. JP-T-2006-504231

SUMMARY OF THE INVENTION

Problem to be Solved by the Invention

Continuous lighting or long-time use of a light source device such as an organic EL lighting device leads to change in luminance intensity ratio among the respective colors producing white light. Consequently, the color temperature of the white light produced by the organic EL lighting device changes from the initial value set in the specifications, resulting in deteriorated initial performance of the organic EL lighting device, for example.

With the foregoing in mind, it is an object of the present invention to provide an organic EL panel control device, a light source device, an organic EL panel control method, a program, and a recording medium, capable of inhibiting the change (shift) in color temperature of white light produced by an organic EL panel.

Means for Solving Problem

In order to achieve the above object, the present invention provides an organic EL panel control device including: a luminance control unit, wherein the luminance control unit controls, among a plurality of organic EL elements with different emission colors in an organic EL panel to be controlled, luminances of organic EL elements other than a reference organic EL element having a shortest luminance life in such a manner that, with reference to a luminance of the reference organic EL element, white light produced by additive color mixture of different colors of light emitted from the plurality of organic EL elements has the same color temperature as a previously set color temperature.

The present invention also provides an organic EL panel control method including a luminance control step, wherein in the luminance control step, among a plurality of organic EL elements with different emission colors in an organic EL panel to be controlled, luminances of organic EL elements other than a reference organic EL element having a shortest luminance life are controlled in such a manner that, with reference to a luminance of the reference organic EL element, white light produced by additive color mixture of different colors of light emitted from the plurality of organic EL elements has the same color temperature as a previously set color temperature.

Effects of the Invention

According to the present invention, it is possible to inhibit the change (shift) in color temperature of white light produced by an organic EL panel to be controlled. Further, according to the present invention, it is also possible to extend the life of an organic EL panel, for example.

MODE FOR CARRYING OUT THE INVENTION

Figure 1:
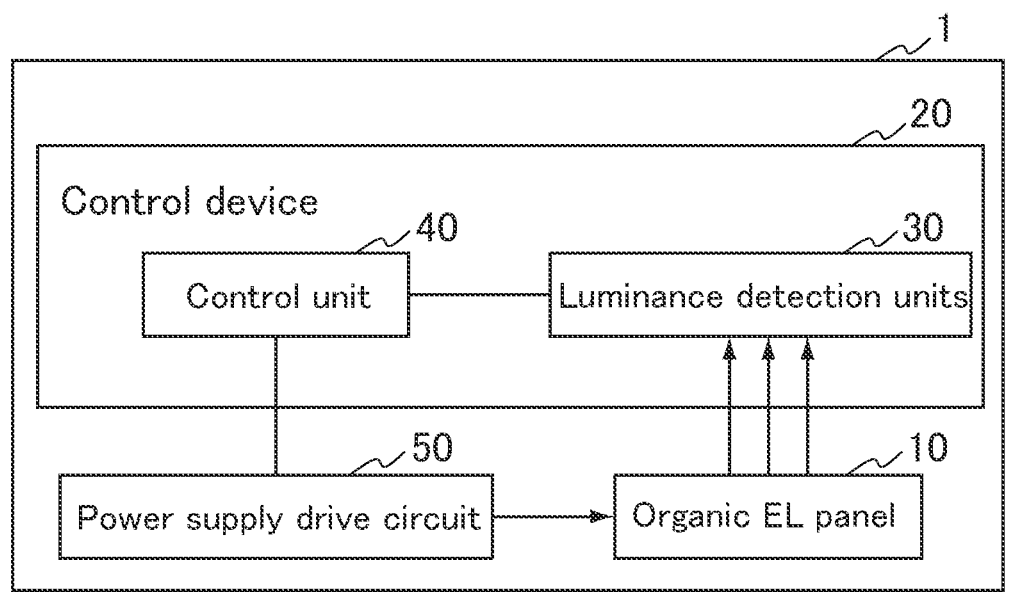
FIG. 1 is a block diagram showing an example of the configuration of an organic EL lighting device according to a first embodiment.

The present invention will be described in detail below with reference to the drawings. It should be noted, however, that the present invention is by no means limited by the following exemplary embodiments. In FIGS. 1 to 9 to be described below, the same components are given the same reference numerals, and duplicate explanations thereof may be omitted. Also, in the drawings, the configuration of each component may be shown in a simplified form as appropriate for the sake of convenience in illustration, and each component may be shown schematically with a dimension ratio etc. different from the actual dimension ratio etc.

First Embodiment

In the present embodiment, the light source device and the organic EL panel control device according to the present invention will be described with reference to an example where the light source device is an organic EL lighting device.

(Organic EL Lighting Device)

FIG. 1 is a block diagram showing the configuration of an organic EL lighting device 1 of the present embodiment. As shown in FIG. 1, the organic EL lighting device 1 of the present embodiment includes, as components: an organic EL panel 10; a control device 20; and a power supply drive circuit 50. The organic EL panel 10 includes a plurality of organic EL elements with different emission colors, as described below. The control device 20 includes, as components: luminance detection units 30; and a control unit 40. As shown in FIG. 1, the control device 20 can transmit electrical signals to the power supply drive circuit 50 via the control unit 40, and the luminance detection units 30 and the control unit 40 can exchange electrical signals between them.

Next, an example of an operation of the organic EL lighting device 1 of the present embodiment will be described. The power supply drive circuit 50 drives the plurality of organic EL elements in the organic EL panel 10 independently of each other. This causes light emissions from the plurality of organic EL elements, whereby the organic EL panel 10 achieves white light emission. Then, the control device 20 detects luminance information regarding the organic EL elements in the organic EL panel 10 by the luminance detection units 30. Subsequently, the luminance detection units 30 transmit the detected luminance information to the control unit 40 in the form of electrical signals, for example. Next, the control unit 40 controls the luminance of each organic EL element on the basis of the luminance information, for example. A specific control method by the control unit 40 will be described below. Then, the control unit 40 transmits luminance control information to the power supply drive circuit 50 in the form of electrical signals. Next, the power supply drive circuit 50 drives the plurality of organic EL elements independently of each other, on the basis of the luminance control information.

The respective components (the organic EL panel, the control device, and the power supply drive circuit) of the organic EL lighting device 1 of the present embodiment will be described below in further detail.

(Organic EL Panel)

Figure 2:
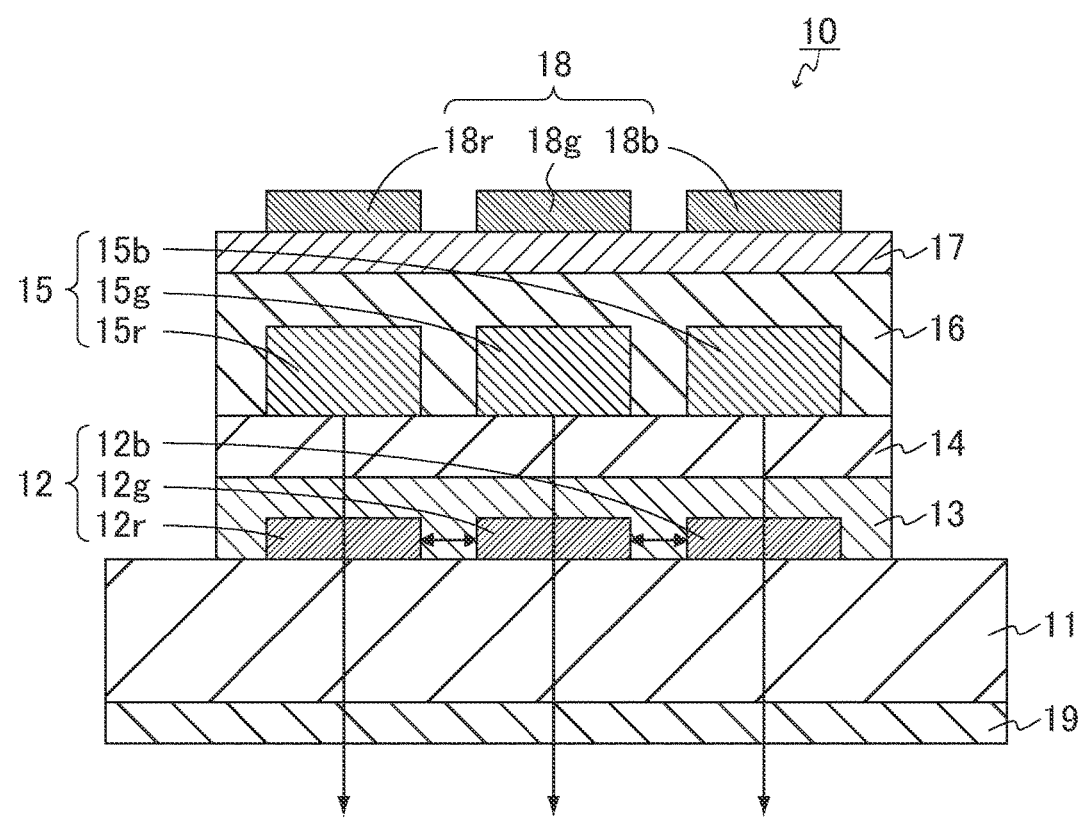
FIG. 2 is a sectional view showing an example of the configuration of an organic EL panel 10 in the first embodiment.

FIG. 2 is a sectional view showing an example of the organic EL panel 10 to be controlled in the present embodiment. The organic EL panel 10 shown in FIG. 2 includes single color light emitting layers 15r, 15g, and 15b for red, green, and blue. With this configuration, the organic EL panel 10 in FIG. 2 produces white light by additive color mixture of the plurality of emission colors.

In the organic EL panel 10 in FIG. 2, anodes 12r, 12g, and 12b provided for the respective light emitting layers (the red light emitting layer 15r, the green light emitting layer 15g, and the blue light emitting layer 15b) are disposed in parallel with each other on one surface of a transparent substrate (glass substrate) 11, and a light diffusion plate 19 is disposed on the other surface of the glass substrate 11. A hole injection layer 13 is formed so as to encapsulate the anodes 12. Further, a hole transport layer 14, the light emitting layers 15, an electron transport layer 16, and an electron injection layer 17 are laminated on the hole injection layer 13 in this order. On the upper side of the electron injection layer 17, cathodes 18r, 18g, and 18b provided for the respective single color light emitting layers 15r, 15g, and 15b are disposed in parallel with each other. Thus, a red light emitting organic EL element, a green light emitting organic EL element, and a blue light emitting organic EL element are constituted. FIG. 2 shows the configuration in which the organic EL panel 10 includes one light emitting organic EL element for each single color (red, green, or blue). It should be noted that FIG. 2 simplifies the actual configuration in which the respective single color light emitting organic EL elements are aligned repeatedly, for the sake of convenience in illustration.

In the organic EL panel 10 shown in FIG. 2, the transparent substrate 11 is a glass substrate. In the present embodiment, the transparent substrate 11 may be a substrate formed of a rigid material, such as a glass substrate, or may be a substrate formed of a flexible material, such as a polymer film.

As described above, the organic EL panel 10 shown in FIG. 2 includes the light diffusion plate 19 as a component. With this configuration, it is possible to prevent total reflection of emitted light owing to the difference in refractive index between the glass substrate 11 and an external air layer, whereby the light extraction efficiency is improved. It should be noted that, in the organic EL panel of the present embodiment, the light diffusion plate is an optional component.

The light emitting layers 15r, 15g, and 15b for the respective colors have their own anodes and cathodes, respectively. Accordingly, currents can be applied to the organic EL elements independently of each other. Thus, it is possible to adjust the luminances of the organic EL elements independently of each other.

A material and method for forming each component in the organic EL panel 10 are not particularly limited, and each component may be formed using a well-known material and a well-known method.

The organic EL panel to be controlled in the present embodiment is not limited to the organic EL panel 10 shown in FIG. 2. The organic EL panel may have a different device configuration such that, for example, the single color light emitting layers 15 are composed of single color light emitting layers for yellow and blue. Also, the organic EL panel may have a different device area(s) such that, for example, the areas of the respective single color light emitting layers may be made larger or smaller as appropriate. Further, the organic EL panel may have a configured such that the single color light emitting layers are composed of white light emitting layers for a color having a high color temperature (e.g., a daylight color) and a color having a low color temperature (e.g., a light bulb color) to provide variations in color temperature of white color. Still further, the organic EL panel including the plurality of single color light emitting layers may be transparent (the so-called two-sided emission organic EL panel that emits light from both sides).

Figure 3:
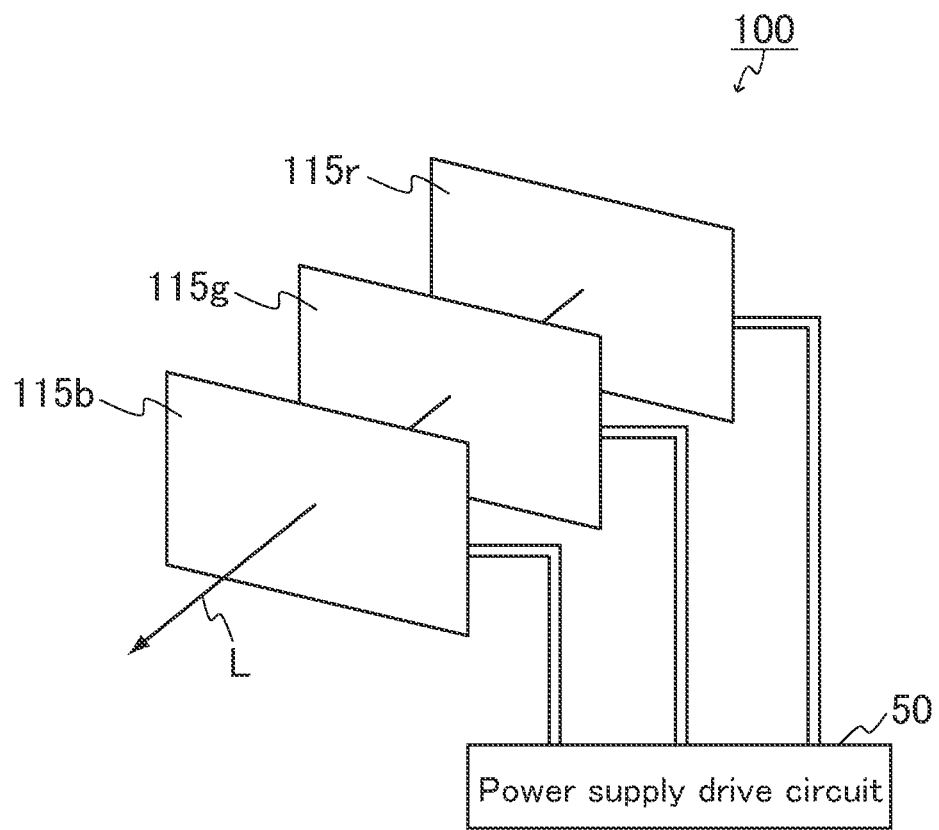
FIG. 3 is a schematic view showing another example of the configuration of the organic EL panel in the first embodiment.

The configuration of the organic EL panel to be controlled in the present embodiment is not limited to the one shown in FIG. 2, in which the respective single color light emitting layers are disposed in parallel. Specifically, for example, the respective organic EL elements may be configured as shown in the schematic view of an organic EL panel 100 in FIG. 3. That is, as shown in FIG. 3, the organic EL elements 115b, 115g, and 115r may be configured so that, for example, they have light transmission properties and are laminated in this order along the emission axis direction L. The organic EL panel 100 shown in FIG. 3 is configured so that the organic EL elements are driven independently of each other by a power supply drive circuit 50. With this configuration, the light emitting area of the organic EL panel 100 is at least three times as large as that of the organic EL panel 10 shown in FIG. 1. This configuration is preferable because it can increase the luminance and luminous flux per unit area.

(Control Device)

The control device 20 of the present embodiment includes, as components: the luminance detection units 30;

and the control unit 40. In the present embodiment, the luminance detection units 30 are optional components.

<Luminance Detection Unit>

The luminance detection units 30 detect the luminances of the respective organic EL elements. More specifically, when the organic EL panel 10 shown in FIG. 1 is to be controlled, the luminance detection units 30 provided for the red light emitting organic EL element, the green light emitting organic EL element, and the blue light emitting organic EL element detect the luminances of these organic EL elements, respectively.

The luminance detection unit 30 is not particularly limited, and may be, for example, a known optical sensor. The optical sensor is not particularly limited, and examples thereof include small sensor elements such as a photodiode, a phototransistor, a photonic integrated circuit (photo IC), and a photoresistor.

Figure 4A:
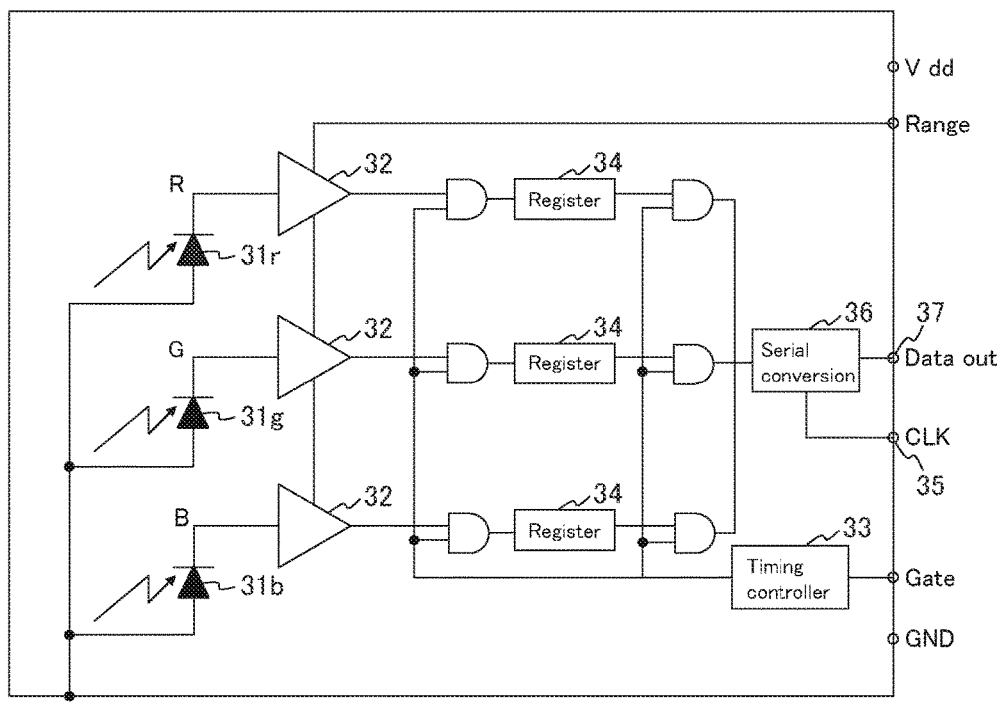
FIGS. 4A and 4B are circuit diagrams showing examples of the configuration of luminance detection units 30 in the first embodiment.

FIG. 4A shows a digital color sensor as an example of a circuit including the luminance detection units 30. As shown in FIG. 4A, first, photodiodes 31*r*, 31*g*, and 31*b* provided for the organic EL elements for respective colors (red, green, and blue) detect the respective colors of light. The respective colors of light thus detected are converted to predetermined frequencies by frequency converters (L/F) 32 and outputted therefrom, respectively. Next, under the timing control of a timing controller 33, the output value of each frequency is counted during the high period of a gate terminal, and the count value is held in a register 34 provided for each organic EL element. Next, pulses for reading out the count values are inputted to a clock (CLK) terminal 35. As a result, the count values for the respective the organic EL elements are converted serially by a converter 36 in synchronization with the pulses, and outputted serially to a Data Out terminal 37 in the form of electrical signals. The electrical signals are processed at, e.g., 10 bits, 12 bits, or the like, and the three colors are read out sequentially. In this manner, the luminances of the organic EL elements for the respective colors detected by the luminance detection units 30 are outputted to the control unit 40. It is to be noted that the above description is directed to an illustrative example of the luminance detection units, and the luminance detection units 30 are not limited thereto as long as they can detect the luminances of the respective organic EL elements and can output the detected luminances to the control unit 40.

Figure 4B:
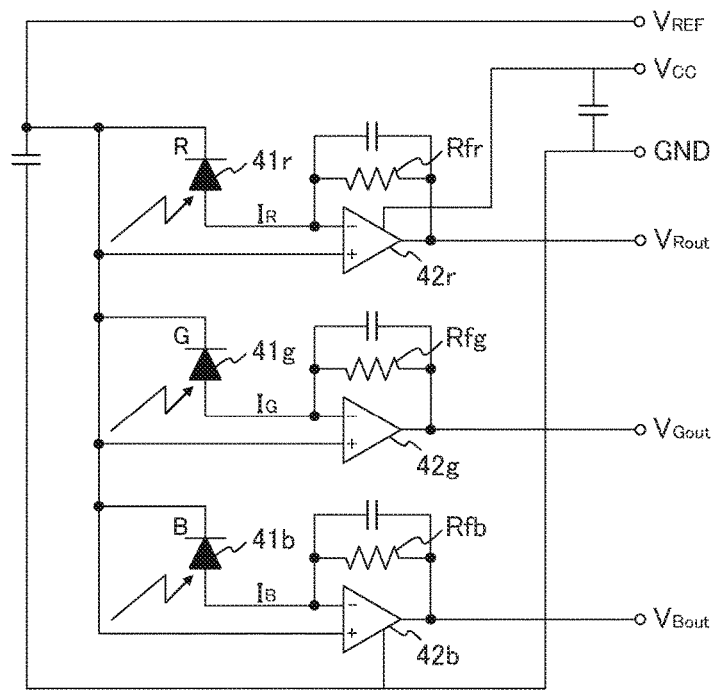

FIG. 4B shows an analog color sensor as another example of the circuit including the luminance detection units 30. The circuit shown in FIG. 4B includes differential amplifiers (OP amplifiers) 42*r*, 42*g*, and 42*b*. Non-inverting input terminals (+) of the differential amplifiers (OP amplifiers) 42*r*, 42*g*, and 42*b* are connected to cathode terminals of photodiodes 41*r*, 41*g*, and 41*b*, respectively. Inverting input terminals (−) of the differential amplifiers (OP amplifiers) 42*r*, 42*g*, and 42*b* are connected to anode terminals of the photodiodes 41*r*, 41*g*, and 41*b*, respectively. Feedback resistors $R_{fr}$, $R_{fg}$, and $R_{fb}$ are provided between the output terminals and the inverting input terminals (−) of the OP amplifiers 41*r*, 41*g*, and 41*b*, respectively. Currents $I_R$, $I_G$, and $I_B$ generated from light received by the photodiodes 41*r*, 41*g*, and 41*b* are subjected to current-voltage (I-V) conversion by the OP amplifiers 42*r*, 42*g*, and 42*b*, respectively, and also, amplified by the magnitudes of the resistances of the feedback resistors Rfr, Rfg, and Rfb. Thus, inverted output voltages ($-I_R - R_{fr}$, $-I_G - R_{fg}$, and $-I_B \times R_{fb}$) are obtained. The output voltages shift toward the negative direction as the amounts of light received by the respective photodiodes 41*r*, 41*g*, and 41*b* increase. Thus, in the case where a single-supply OP amplifier is used, an offset voltage is applied to a non-inverting input terminal (+) so as to cause an output to shift toward the negative direction with respect to the offset voltage as a reference potential. The output voltage for each color ($V_{Rout}$, $V_{Gout}$, or $V_{Bout}$) is obtained as the difference between the offset voltage $V_{ofs}$ and the product of the current generated from the light received and the resistance of the feedback resistor ($I_R \times R_{fr}$, $I_G \times R_{fg}$, or $I_B \times R_{fb}$).

The positions at which the luminance detection units 30 are disposed are not particularly limited. For example, the luminance detection units 30 may be disposed in the organic EL panel 10. Specifically, the luminance detection units 30 may be disposed on the glass substrate of the organic EL panel 10, for example.

<Control Unit>

The control unit 40 performs luminance control in such a manner that white light produced by additive color mixture of different colors of light emitted from the plurality of organic EL elements has the same color temperature as a previously set color temperature, on the basis of the detected luminance information regarding each of the organic EL elements. More specifically, the control unit 40 controls the luminances of organic EL elements other than a reference organic EL element having the shortest luminance life, with reference to the luminance of the reference organic EL element.

In the present embodiment, the "previously set" color temperature is not particularly limited, and may be, for example, an initial color temperature set during manufacture or a color temperature set by a user after the manufacture. Also, for example, some living environment-compatible lighting devices are color tunable so as to emit daylight color light in the morning, natural white light in the daytime, and light bulb color light at night. More specifically, the lighting devices emit different colors of light, e.g., daylight color light to help pleasant awakening in the morning, active natural white light in the daytime, and relaxing light bulb color light at night. In such a case, the color temperature may be set according to time so as to confirm to living environments.

In the present embodiment, the "organic EL element having the shortest luminance life" is not particularly limited, and may be a blue light emitting organic EL element or an organic EL element with any other emission color, for example. In principle, the blue light emitting organic EL element has the shortest life among the light emitting organic EL elements for the respective colors that produce white light. However, the organic EL elements with other emission colors may exhibit totally different luminance life behavior or properties, depending on light emitting materials and peripheral materials in the multi-layer structure, element and device configurations, processes to be employed, etc. Also, variation among lots of the materials etc., inconsistency among process steps, and the like may influence the luminance life. Thus, in the present embodiment, it is preferable that the luminance detection units 30 detect the change in luminance with time regarding the respective organic EL elements whenever necessary to determine the organic EL element with the shortest luminance life whenever necessary. With this configuration, for example, it is possible to prevent the increase in driving current for the element with the shortest life, whereby life time reduction due to the increase in drive conditions and load for the element with the shortest life can be inhibited.

In the present embodiment, "controlling the luminances of organic EL elements other than a reference organic EL element having the shortest luminance life" is not particularly limited, and may mean, for example, lowering the luminances of the organic EL elements. It should be noted that, as described above, the luminances of the organic EL elements may be controlled in such a manner that the white light has the same color temperature as the previously set color temperature. Thus, it is not necessary to lower the luminances of the organic EL elements in the case where the white light has the same color temperature as the previously set color temperature without lowering the luminances of the organic EL elements, for example.

An example of a specific configuration of the control unit 40 is such that, for example, the control unit 40 includes, as components: a storage section; and an arithmetic section.

<Storage Section>

The storage section stores information on change with time in luminance measured previously for each of the organic EL elements. The storage section is not particularly limited, and may be, for example, a random-access memory (RAM), a read-only memory (ROM), a hard disk (HD), an optical disk, a Floppy® disk (FD), or the like.

Figure 5:
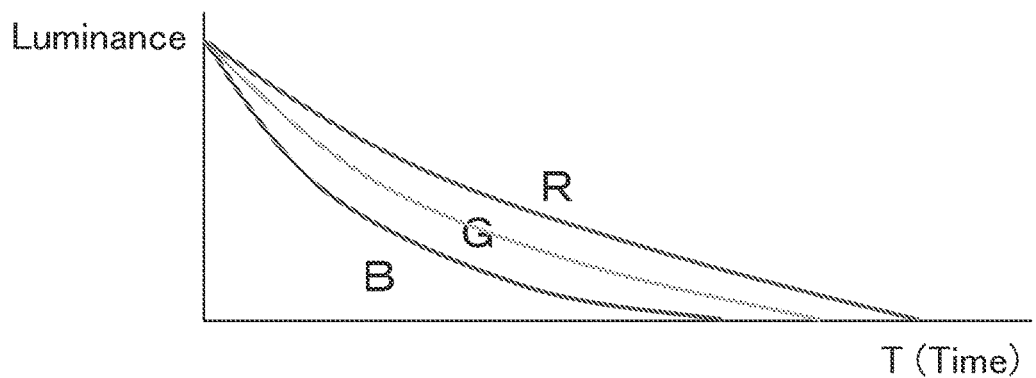
FIG. 5 is a graph showing an example of luminance life curves regarding organic EL elements in the first embodiment.

The "information on change with time" is not particularly limited, and may be, for example: information on reduction in luminance or luminous flux with time, obtained by the luminance life curves regarding the respective organic EL elements (blue (B), green (G), and red (R)) shown in FIG. 5; information on change in chromaticity with time regarding the respective single color light emitting layers, accompanying the drive of the organic EL panel; or the like. FIG. 5 shows an example of common luminance life curves regarding the respective organic EL elements.

<Arithmetic Section>

The arithmetic section determines driving currents or driving voltages for the organic EL elements other than the reference organic EL, on the basis of the information on change with time. The following description is directed to a specific example where, for example, the information on change with time is information on reduction in luminance with time obtained by the luminance life curves. The arithmetic section fixes the luminance of an organic EL element for a color with the largest luminance reduction on the basis of the information on the reduction, and calculates driving currents or driving voltages for driving the organic EL elements for other colors so that the white color temperature obtained by additive color mixture would be the same as the previously set white color temperature. The arithmetic section may determine either driving currents or driving voltages as described above. Preferably, the arithmetic section determines driving currents. With this configuration, it is possible to provide an organic EL panel having a longer life and compatible to change in environments such as change in temperature.

In the present embodiment, on the basis of the information on change with time obtained from data obtained by measuring or examining change in luminance (luminous flux) with time regarding light emitting materials for the respective colors in an actual device, tone values of the respective colors further may be set so as to coincide with the chromaticity coordinates on the black body locus, with reference to the luminance (luminous flux) of a color with the shortest life. The luminance (luminous flux) life of the light emitting organic EL element for each color in the organic EL panel is determined uniquely according to the material and device configuration used therein and the light emitting area. Then, the information on change with time in luminance (luminous flux) determined according to the material and device configuration used for each color and the device area is used as an index of the luminance life. Then, the control unit 40 controls, with reference to the luminance (luminous flux) of the color with the shortest life, the luminances (luminous fluxes) of the other colors so as to coincide with the chromaticity coordinates on the black body locus. In this case, for example, conversion from the information on change with time regarding the light emitting organic EL elements for respective colors to corrected output tone values may be performed with reference to a reference table.

Table 1 shows an example of the reference table. Table 1 shows an example of a reference table in the case where: the emission colors are composed of three colors, namely, red, green, and blue; a blue light emitting organic EL element has the shortest life and thus provides a reference tone, and the respective colors are controlled at 8 bits.

TABLE 1

| Inputted tone value | | | Corrected tone value | | |
|---|---|---|---|---|---|
| R | G | B | R | G | B |
| 0 | 0 | 0 | 0 | 0 | 0 |
| 1 | 1 | 1 | 1 | 1 | 1 |
| 2 | 2 | 2 | 2 | 2 | 2 |
| — | — | — | — | — | — |
| 127 | 127 | 127 | 119 | 110 | 127 |
| — | — | — | — | — | — |
| 250 | 250 | 250 | 229 | 211 | 250 |
| 251 | 251 | 251 | 229 | 211 | 251 |
| 252 | 252 | 252 | 230 | 212 | 252 |
| 253 | 253 | 253 | 231 | 212 | 253 |
| 254 | 254 | 254 | 232 | 213 | 254 |
| 255 | 255 | 255 | 233 | 214 | 255 |

The storage section may store the information on change with time and the reference table, for example. The storage section may read out a corresponding value from the reference table with respect to an inputted value regarding either the tone value or information on change with time (e.g., a luminance (luminous flux) change ratio). Specifically, for example, when the inputted tone value is "127", the storage section reads out "119" as the corrected tone value for the red light emitting organic EL element and "110" as the corrected tone value for the green light emitting organic EL element. Then, the storage section transmits the tone value data to the arithmetic section. It should be noted, however, that the reference table in the present embodiment is not limited thereto. For example, although the respective colors are controlled at 8 bits in the reference table shown as Table 1, the number of tones may be increased to 10 bits or 12 bits in order to attain more smooth conversion.

When the reference table is used in the present embodiment, the control unit 40 may include, for example, a preparation unit that previously prepares correspondence between inputted luminances and luminances to be outputted by providing conversion correspondence tables indicating luminances to be outputted in response to inputted luminances for the respective tones. Such a configuration can be achieved easily by using a field-programmable gate array (FPGA), for example. Although the present embodiment is directed to an example where the reference table includes discrete (quantized, digital) values, the reference table may include continuous values. Further, although the present embodiment is directed to an example where a reference table is used, functions may be used instead of the reference table.

(Power Supply Drive Circuit)

The power supply drive circuit 50 drives the plurality of organic EL elements in the organic EL panel to be controlled independently of each other, on the basis of the luminance control information provided by the control device 40. In the present embodiment, the power supply drive circuit 50 is an optional component and may not be provided.

The power supply drive circuit 50 is not particularly limited, and may be, for example, a unit that supplies driving currents to the respective organic EL elements.

In the present embodiment, in accordance with electrical signals of the luminance control information, the power supply drive circuit 50 may control the driving currents to be supplied by, for example, pulse width modulation (PWM) or pulse amplitude modulation (PAM). The driving currents preferably are controlled by PWM, because they can be controlled more easily. Also, driving currents and driving voltages may be controlled by performing PWM and PAM at the same time.

(Control Method)

Figure 6:
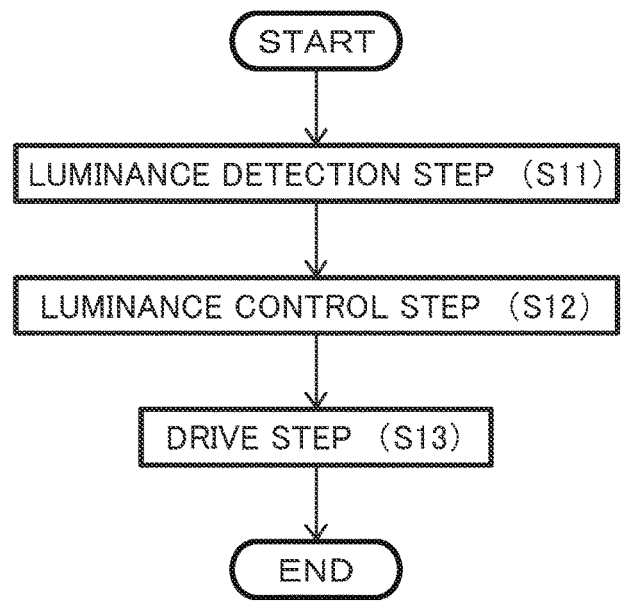
FIG. 6 is a flowchart showing an example of a control method according to the first embodiment.

Next, a method for controlling the organic EL panel using the control device 20 in the present embodiment will be described with reference to the flowchart of FIG. 6. It should be noted, however, that the control method according to the present invention is not limited to the one performed using the control device 20.

<Luminance Detection Step (S11)>

First, the luminance detection unit 30 detects luminance information regarding the organic EL elements independently of each other. The detected luminance information is converted to, for example, an electrical signal and transmitted to the control unit 40.

<Luminance Control Step (S12)>

Next, the control unit 40 performs luminance control in such a manner that white light produced by additive color mixture of different colors of light emitted from the plurality of organic EL elements has the same color temperature as a previously set color temperature, on the basis of the detected luminance information regarding the respective organic EL elements. That is, the control unit 40 controls the luminances of organic EL elements other than a reference organic EL element having the shortest luminance life with reference to the luminance of the reference organic EL element. Specifically, the control unit 40 determines, with reference to the detected luminances of the light emitting organic EL elements for the respective colors, the light emitting organic EL element for a color with the largest luminance reduction, for example. Then, for example, the control unit 40 fixes a driving current to be supplied to the light emitting organic EL element for the color with the largest luminance reduction, and lowers driving currents to be supplied to the light emitting organic EL elements for the other colors. In the case where a blue light emitting organic EL element is fixed as the light emitting organic EL element for the color with the largest luminance reduction, driving currents to be supplied to the light emitting organic EL elements for other colors, namely, red and green, are lowered so that white light to be produced has the same color temperature as a previously set color temperature.

Figure 7:
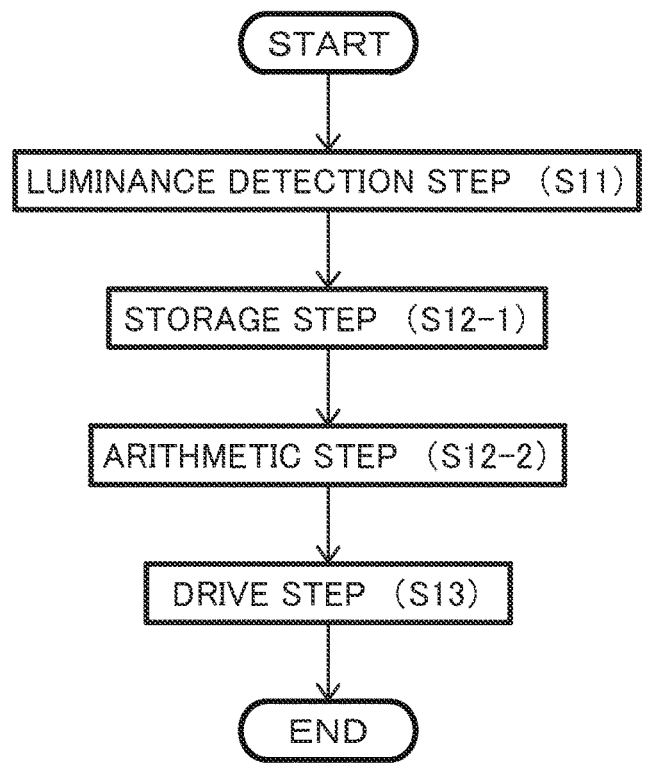
FIG. 7 is a flowchart showing another example of the control method according to the first embodiment.

As shown in the flowchart of FIG. 7, the luminance control step may include a storage step (S12-1) and an arithmetic step (S12-2), for example. In the storage step, for example, the storage section stores information on change with time in luminance measured previously for the respective organic EL elements (storage step, S12-1). In the arithmetic step, for example, on the basis of the information on change with time, the arithmetic section determines driving currents or driving voltages for the organic EL elements other than the reference organic EL element (arithmetic step, S12-2).

<Drive Step (S13)>

Next, the power supply drive circuit 50 drives the plurality of organic EL elements independently of each other, on the basis of the luminance control information supplied by the control unit 40. In the control method according the present invention, the present step (S13) is an optional step.

In the present embodiment, as described above, the control device 20 controls the luminances of the other organic EL elements in such a manner that white light to be produced has the same color temperature as an initially set color temperature, with reference to the luminance of the organic EL element with the shortest luminance life. With this configuration, it becomes possible to correct color temperature shift or color shift with time caused by continuous lighting or continuous use, while such correction is difficult in common white organic EL elements. As a result, in the organic EL panel to be controlled, change in color temperature can be inhibited. Thus, the control device 20 can efficiently inhibit, for example, the reduction in luminance (luminous flux) life of an organic EL element for each color in the organic EL panel to be controlled, thereby extending the life of the organic EL panel.

Second Embodiment

Figure 8:
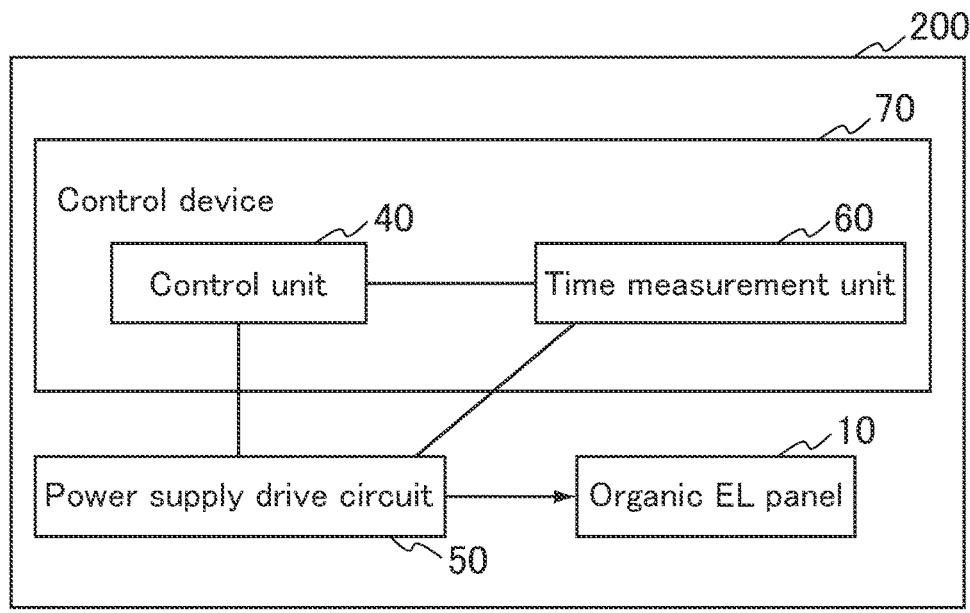
FIG. 8 is a block diagram showing an example of the configuration of an organic EL lighting device according to a second embodiment.

FIG. 8 is a block diagram showing the configuration of an organic EL lighting device 200 according to the present embodiment. A control device 70 of the present embodiment includes a time measurement unit 60. The time measurement unit 60 measures the drive times of the organic EL elements. An arithmetic section of a control unit 40 determines driving currents or driving voltages by associating the drive times measured by the time measurement unit 60 with the information on change with time stored by the storage section. The time measurement unit 60 can transmit and receive electrical signals to and from the control unit 40 and the power supply drive circuit 50. Except for the above, the control device 70 of the present embodiment has the same configuration as the control device 20 of the first embodiment. In the present embodiment, luminance detection units are optional components, and may or may not be provided.

(Time Measurement Unit)

The time measurement unit 60 measures the drive time of each organic EL element, as described above. In the present embodiment, the "drive time" is not particularly limited, and may be, for example, the drive time of the organic EL element accumulated during a time period from the reception of a reset signal from the power supply drive circuit 50 until the time of measurement.

The time measurement unit 60 is not particularly limited, and a known time measurement unit such as a timer can be used, for example. The timer may be, for example, a microcomputer/IC timer configured so as to supply a clock to a register to reset or start counting and determine a measured value by causing the register that reads out count values to accumulate the count values.

(Control Method)

Figure 9:
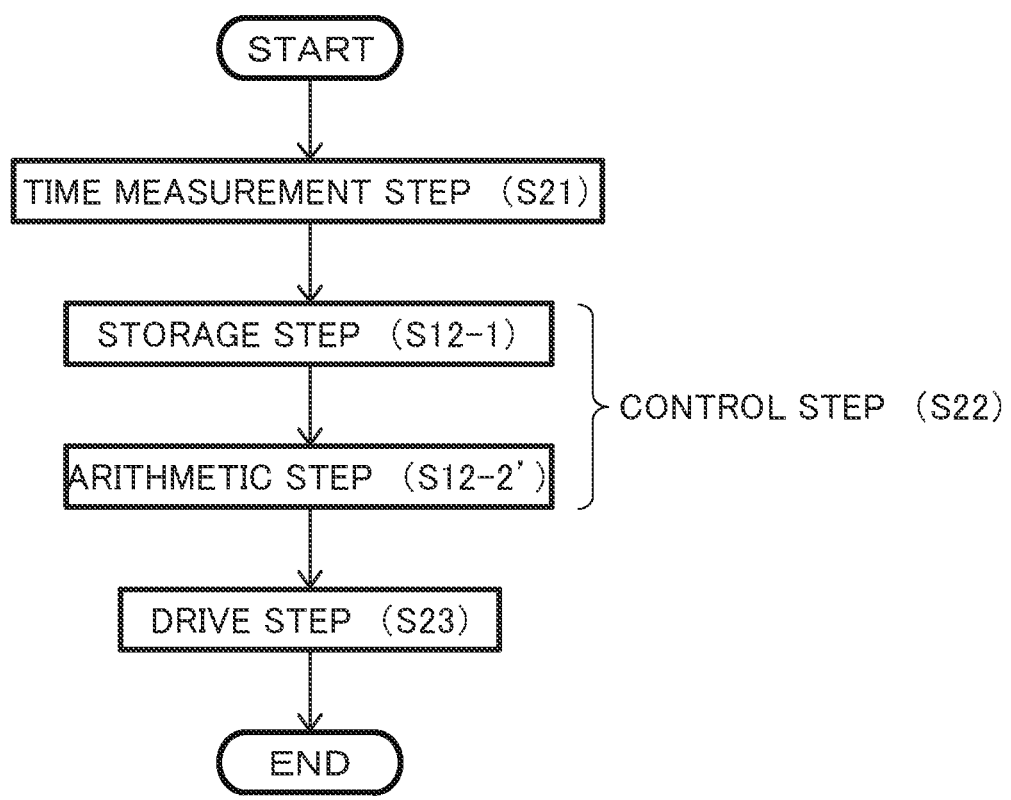
FIG. 9 is a flowchart showing an example of a control method according to the second embodiment.

Next, a method for controlling the organic EL panel using the control device 70 in the present embodiment will be described with reference to the flowchart of FIG. 9. It should be noted, however, that the control method according to the present invention is not limited to the one performed using the control device 70.

<Time Measurement Step (S21)>

First, in a time measurement step, the time measurement unit 60 determines a drive time accumulated from the reception of a reset signal.

<Control Step (S22)>

In a control step, first, S12-1 in the first embodiment is performed. Thereafter, the arithmetic section of the control unit 40 determines driving currents or driving voltages by associating the drive times measured by the time measurement unit 60 with the information on change with time stored by the storage section (S12-2'). In this case, conversion from the information on change with time regarding the respective colors to corrected tone values may be performed, as described in the first embodiment.

<Drive Step (S23)>

A drive step is performed in the same manner as S13 in the first embodiment.

Also in the present embodiment, as described above, the control device 70 controls the luminances of the other organic EL elements in such a manner that white light to be produced has the same color temperature as an initially set color temperature, with reference to the luminance of the organic EL element with the shortest luminance life. With this configuration, it becomes possible to correct color temperature shift or color shift with time caused by continuous lighting or continuous use, while such correction is difficult in common white organic EL elements. As a result, in the organic EL panel to be controlled, change in color temperature can be inhibited. Thus, the control device 70 can efficiently inhibit, for example, the reduction in luminance (luminous flux) life of an organic EL element for each color in the organic EL panel to be controlled, thereby extending the life of the organic EL panel.

Furthermore, in the present embodiment, for example, by causing a central processing unit (CPU) of the power supply drive circuit to execute the control method as a program, it is possible to cause the CPU to output signals of driving currents for the respective colors, and in accordance with the signals, to cause optimal driving currents for the organic EL elements for the respective colors to be inputted to the organic EL elements for the respective colors from the power supply drive circuit. With this configuration, it is possible to correct color temperature shift and color shift with time caused by continuous lighting or continuous use.

Third Embodiment

A program according to the present embodiment is a program that can execute the control method according to the first embodiment or 2 on a computer. Alternatively, the program according to the present embodiment may be recorded on a computer-readable recording medium, for example. The recording medium is not particularly limited, and may be, for example, a read-only memory (ROM), a hard disk (HD), or an optical disk.

In the present embodiment, it is preferable that the program is executed by the CPU of the power supply drive circuit. Further, it is preferable to cause the CPU to output signals of driving currents for the respective colors using the program, and to cause optimal driving currents for the organic EL elements for the respective colors to be inputted to the organic EL elements for the respective colors from the power supply drive circuit, in accordance with the signals. With this configuration, it is possible to correct color temperature shift and color shift with time caused by continuous lighting or continuous use. Besides, the configuration of the light source device can be simplified.

Although Embodiments 1 and 2 are each directed to an example where the light source device according to the present invention is an organic EL lighting device, the light source device according to the present invention is not limited thereto. For example, the control device according to the present invention is applicable to, e.g., a backlight of a liquid crystal display. Thus, the light source device according to the present invention may be a liquid crystal display.

While the present invention has been described above with reference to exemplary embodiments, the present invention is by no means limited thereto. Various changes and modifications that may become apparent to those skilled in the art may be made in the configuration and specifics of the present invention without departing from the scope of the present invention.

Part or the whole of the exemplary embodiments disclosed above can be described as in the following supplementary notes. It should be noted, however, that the present invention is by no means limited thereto.

(Supplementary Note 1)

An organic EL panel control device including:

a luminance control unit, wherein the luminance control unit controls, among a plurality of organic EL elements with different emission colors in an organic EL panel to be controlled, luminances of organic EL elements other than a reference organic EL element having a shortest luminance life in such a manner that, with reference to a luminance of the reference organic EL element, white light produced by additive color mixture of different colors of light emitted from the plurality of organic EL elements has the same color temperature as a previously set color temperature.

(Supplementary Note 2)

The organic EL panel control device according to Supplementary Note 1, wherein the luminance control unit lowers the luminances of the organic EL elements other than the reference organic EL element.

(Supplementary Note 3)

The organic EL panel control device according to Supplementary Note 1 or 2, further including luminance detection units provided for the respective organic EL elements, wherein the luminance detection units detect luminance information regarding the respective organic EL elements, and on the basis of the detected luminance information regarding the respective organic EL elements, the luminance control unit controls the luminances of the organic EL elements other than the reference organic EL element.

(Supplementary Note 4)

The organic EL panel control device according to any one of Supplementary Notes 1 to 3, wherein the luminance control unit includes a storage section and an arithmetic section, the storage section stores information on change in luminance with time measured previously for the respective organic EL elements, and on the basis of the information on change in luminance with time, the arithmetic section determines driving currents or driving voltages for the organic EL elements other than the reference organic EL element.

(Supplementary Note 5)

The organic EL panel control device according to Supplementary Note 4, further including a time measurement unit, wherein the time measurement unit measures drive times of the respective organic EL elements, and the arithmetic section of the luminance control unit determines the driving currents or the driving voltages by associating the drive times measured by the time measurement unit with the information on change with time stored by the storage section.

(Supplementary Note 6)

A light source device including:

an organic EL panel; and the organic EL panel control device according to any one of Supplementary Notes 1 to 5, wherein the organic EL panel includes a plurality of organic EL elements with different emission colors.

(Supplementary Note 7)

The light source device according to Supplementary Note 6, wherein the organic EL panel further includes a power supply drive circuit, and the power supply drive circuit drives the plurality of organic EL elements independently of each other, on the basis of luminance control information provided by the control device.

(Supplementary Note 8)

The light source device according to Supplementary Note 6 or 7, wherein the organic EL elements have light transmission properties and are laminated along an emission axis direction.

(Supplementary Note 9)

The light source device according to any one of Supplementary Notes 6 to 8, wherein the reference organic EL element is a blue light emitting organic EL element.

(Supplementary Note 10)

An organic EL panel control method including:

a luminance control step, wherein in the luminance control step, among a plurality of organic EL elements with different emission colors in an organic EL panel to be controlled, luminances of organic EL elements other than a reference organic EL element having a shortest luminance life are controlled in such a manner that, with reference to a luminance of the reference organic EL element, white light produced by additive color mixture of different colors of light emitted from the plurality of organic EL elements has the same color temperature as a previously set color temperature.

(Supplementary Note 11)

The organic EL panel control method according to Supplementary Note 10, wherein, in the luminance control step, the luminances of the organic EL elements other than the reference organic EL element are lowered.

(Supplementary Note 12)

The organic EL panel control method according to Supplementary Note 10 or 11, further including:

a luminance detection step, wherein, in the luminance detection step, luminance information regarding the respective organic EL elements is detected, and in the luminance control step, on the basis of the detected luminance information regarding the respective organic EL elements, the luminances of the organic EL elements other than the reference organic EL element are controlled.

(Supplementary Note 13)

The organic EL panel control method according to any one of Supplementary Notes 10 to 12, wherein the luminance control step further includes a storage step and an arithmetic step, in the storage step, information on change in luminance with time measured previously for the respective organic EL elements is stored, and in the arithmetic step, on the basis of the information on change in luminance with time, driving currents or driving voltages for the organic EL elements other than the reference organic EL element are determined.

(Supplementary Note 14)

The organic EL panel control method according to Supplementary Note 13, further including a time measurement step, wherein in the time measurement step, drive times of the respective organic EL elements are measured, and in the arithmetic step of the luminance control step, the driving currents or the driving voltages are determined by associating the drive times measured in the time measurement step with the information on change with time stored in the storage step.

(Supplementary Note 15)

A program that executes the control method according to any one of Supplementary Notes 10 to 14 on a computer.

(Supplementary Note 16)

A computer-readable recording medium having recorded thereon the program according to Supplementary Note 15.

This application claims priority from Japanese Patent Application No. 2014-131847 filed on Jun. 26, 2014. The entire disclosure of this Japanese patent application is incorporated herein by reference.

EXPLANATION OF REFERENCE NUMERALS

1: organic EL lighting device
10, 100: organic EL panel
11: glass substrate
12r, 12b, 12g: anode
13: hole injection layer
14: hole transport layer
15r, 15g, 15b, 115r, 115b, 115g: single color light emitting layer
16: electron transport layer
17: electron injection layer
18r, g, b: cathode
19: light diffusion plate
20, 70: control device
30: luminance detection unit
31r, g, b: photodiode
32: frequency converter
33: timing controller
34: register
35: clock (CLK) terminal
36: converter
37: Data Out terminal
40: control unit
50: power supply drive circuit
60: time measurement unit

The invention claimed is:

1. An organic EL panel control device comprising:

a luminance control unit, wherein the luminance control unit controls, among a plurality of organic EL elements with different emission colors in an organic EL panel to be controlled, luminances of organic EL elements other than a reference organic EL element having a shortest luminance life in such a manner that, with reference to a luminance of the reference organic EL element, white light produced by additive color mixture of different colors of light emitted from the plurality of organic EL elements has the same color temperature as a previously set color temperature.

2. The organic EL panel control device according to claim 1, further comprising luminance detection units provided for the respective organic EL elements, wherein the luminance detection units detect luminance information regarding the respective organic EL elements, and on the basis of the detected luminance information regarding the respective organic EL elements, the luminance control unit controls the luminances of the organic EL elements other than the reference organic EL element.

3. The organic EL panel control device according to claim 1, wherein the luminance control unit comprises a storage section and an arithmetic section, the storage section stores information on change in luminance with time measured previously for the respective organic EL elements, and on the basis of the information on change in luminance with time, the arithmetic section determines driving currents or driving voltages for the organic EL elements other than the reference organic EL element.

4. A light source device comprising:

an organic EL panel; and the organic EL panel control device according to claim 1, wherein the organic EL panel comprises a plurality of organic EL elements with different emission colors.

5. The light source device according to claim 4, wherein the organic EL elements have light transmission properties and are laminated along an emission axis direction.

6. An organic EL panel control method comprising:

a luminance control step, wherein in the luminance control step, among a plurality of organic EL elements with different emission colors in an organic EL panel to be controlled, luminances of organic EL elements other than a reference organic EL element having a shortest luminance life are controlled in such a manner that, with reference to a luminance of the reference organic EL element, white light produced by additive color mixture of different colors of light emitted from the plurality of organic EL elements has the same color temperature as a previously set color temperature.

7. The organic EL panel control method according to claim 6, further comprising:

a luminance detection step, wherein, in the luminance detection step, luminance information regarding the respective organic EL elements is detected, and in the luminance control step, on the basis of the detected luminance information regarding the respective organic EL elements, the luminances of the organic EL elements other than the reference organic EL element are controlled.

8. The organic EL panel control method according to claim 6, wherein the luminance control step further comprises a storage step and an arithmetic step, in the storage step, information on change in luminance with time measured previously for the respective organic EL elements is stored, and in the arithmetic step, on the basis of the information on change in luminance with time, driving currents or driving voltages for the organic EL elements other than the reference organic EL element are determined.

9. The organic EL panel control device according to claim 2, wherein the luminance control unit comprises a storage section and an arithmetic section, the storage section stores information on change in luminance with time measured previously for the respective organic EL elements, and on the basis of the information on change in luminance with time, the arithmetic section determines driving currents or driving voltages for the organic EL elements other than the reference organic EL element.

10. The organic EL panel control method according to claim 7, wherein the luminance control step further comprises a storage step and an arithmetic step, in the storage step, information on change in luminance with time measured previously for the respective organic EL elements is stored, and in the arithmetic step, on the basis of the information on change in luminance with time, driving currents or driving voltages for the organic EL elements other than the reference organic EL element are determined.

* * * * *